United States Patent [19]
Khoury et al.

[11] Patent Number: 5,298,975
[45] Date of Patent: Mar. 29, 1994

[54] COMBINED SCANNING FORCE MICROSCOPE AND OPTICAL METROLOGY TOOL

[75] Inventors: Henri A. Khoury, Yorktown Heights; Calvin K. Chi, Elmhurst; Joachim G. Clabes, Yorktown Heights; Philip C. D. Hobbs, Briarcliff Manor; Laszlo Landstein, Ossining; Martin P. O'Boyle, Peekskille; Hemantha K. Wickramasinghe, Chappaqua; Sandra K. Wolterman, Billings, all of N.Y.

[73] Assignee: International Business Machines Corporation, Armonk, N.Y.

[21] Appl. No.: 767,300

[22] Filed: Sep. 27, 1991

[51] Int. Cl.$^5$ .................... G01B 11/02; G01B 11/04
[52] U.S. Cl. .................... 356/375; 356/376; 356/384; 250/306; 73/105
[58] Field of Search .......... 356/375, 376, 384–387; 73/105; 250/306, 307, 442.11, 492.1, 492.2, 492.3, 423 F

[56] References Cited

U.S. PATENT DOCUMENTS

| | | | |
|---|---|---|---|
| 3,087,329 | 4/1963 | Von Grodek et al. | 73/105 |
| 4,506,154 | 3/1985 | Scire | 250/442.1 |
| 4,668,865 | 5/1987 | Gimzewski et al. | 250/306 |
| 4,724,318 | 2/1988 | Binnig | 250/306 |
| 4,747,698 | 5/1988 | Wickramasinghe | 374/6 |
| 4,767,926 | 8/1988 | Murakoshi et al. | 250/310 |
| 4,800,274 | 1/1989 | Hansma | 250/306 |
| 4,806,755 | 2/1989 | Duerig et al. | 250/306 |
| 4,811,594 | 3/1989 | Dvorsky | 73/105 |
| 4,837,435 | 6/1989 | Sakuhara et al. | 250/306 |
| 4,851,671 | 7/1989 | Pohl | 250/306 |
| 4,851,767 | 7/1989 | Halbout et al. | 324/158 P |
| 4,883,959 | 11/1989 | Hosoki et al. | 250/306 |
| 4,884,890 | 12/1989 | Coates | 356/384 |
| 4,888,550 | 12/1989 | Reid | 324/158 P |
| 4,894,537 | 1/1990 | Blackford et al. | 250/306 |
| 4,902,892 | 2/1990 | Okayama et al. | 250/307 |
| 4,906,840 | 3/1990 | Zdeblick et al. | 250/306 |
| 4,912,822 | 4/1990 | Zdeblick et al. | 29/25.35 |
| 4,916,315 | 4/1990 | Otaka | 250/310 |
| 4,918,309 | 4/1990 | Beha et al. | 250/306 |
| 4,924,091 | 5/1990 | Hansma et al. | 250/306 |
| 5,144,833 | 9/1992 | Amer et al. | 356/376 |
| 5,245,863 | 9/1993 | Kajimura et al. | 356/376 |

FOREIGN PATENT DOCUMENTS

| | | |
|---|---|---|
| 413040A1 | 2/1991 | European Pat. Off. |
| 413041A1 | 2/1991 | European Pat. Off. |
| 413042A1 | 2/1991 | European Pat. Off. |
| 1-224603 | 9/1989 | Japan |

OTHER PUBLICATIONS

"Microprobe-Based CD Measurement Tool" IBM Technical Disclosure Bulletin, vol. 32, No. 7, p. 168 (Dec. 1989).

D. Ruger, et al., "Atomic Force Microscopy" Physics Today, pp. 23–30 (Oct. 1990).

(List continued on next page.)

Primary Examiner—Richard A. Rosenberger
Assistant Examiner—Hoa Q. Pham
Attorney, Agent, or Firm—Aziz M. Ahsan

[57] ABSTRACT

An integrated scanning force microprobe and optical microscopy metrology system is disclosed, that measures the depth and width of a trench in a sample. The probe remains fixed while the sample is moved relative to the probe. The system detects the proximity of the probe to a sample and to the side walls of the trench, providing output signals indicating the vertical and transverse relationship of the probe to the sample. The system adjusts the relative position of the sample vertically and transversely as a function of the output signals. Variety of probes can be used with this system to detect the depth and width of the trench. The probe should have at least one protuberance extending down to sense the bottom of the trench. The tip of the probe can have Lateral protuberances that can extend in opposite directions (across the width of the trench) from the probe to detect the side walls of the trench. Forces on the protuberances are measured to determine the depth and the location of the side walls of the trench.

29 Claims, 7 Drawing Sheets

OTHER PUBLICATIONS

U.S. patent application Ser. No. 07/568,451 filed on Aug. 16, 1990, entitled "Method of Producing Ultrafine Silicon Tips for the AFM/STM Profilometry" IBN Docket No. GE9-89-009.

G. Binnig, et al., "Atomic Force Microscope" Physical Review Letters, vol. 56, No. 9, pp. 930-933 (Mar. 3, 1986).

Y. Martin, et al., "Atomic Force Microscope-Force Mapping and Profiling on a Sub 100-Å Scale" J. Appl. Phys. 61 (10), pp. 4723-4729 (May 15, 1987).

K. L. Lee, et al., "Direct Electron-Beam Patterning for Nanolithography" J. Vac. Sci. Technol. B 7 (6) pp. 1941-1946 (Nov./Dec. 1989).

U.S. patent application Ser. No. 07/608,043 filed on Oct. 31, 1990 entitled "Nanometer Scale Probe for an Atomic Force Microscope and Method for Making Same" IBM Docket No. YO9-90-143.

U.S. patent application Ser. No. 07/619,378 filed on Nov. 28, 1990 entitled "Microprobe-Based CD Measurement Tool" IBM Docket No. FI9-90-063.

COMBINED SCANNING FORCE MICROSCOPE AND OPTICAL METROLOGY TOOL

CROSS-REFERENCE

This Patent Application is related to U.S. patent application Ser. No. 07/568,451, filed on Aug. 16, 1990 now U.S. Pat. No. 5,242,541, entitled "Method of Producing Ultrafine Silicon Tips for the AFM/STM Profilometry", and U.S. patent application Ser. No. 07/608,043, filed on Oct. 31, 1990, entitled "Nanometer Scale Probe for an Atomic Force Microprobe, and Method for Making Same," and U.S. patent application Ser. No. 07/619,378 now abandoned, entitled "Microprobe-Based CD Measurement Tool", and which are all assigned to the same assignee as this Patent Application, and the disclosure of all of them is incorporated herein by reference.

FIELD OF THE INVENTION

This invention relates generally to a metrology tool, and more specifically to the measurement of linewidths, trenches and overlays, using a new combined scanning force microscope and optical metrology tool. A cantilever beam having a tip is lowered into the measurement area using an opto-electronic feedback system. The cantilever beam is vibrated at or near its natural frequency. The sample or the probe is moved and the change in position is measured using either a laser interferometric feedback system or an optical feedback system. The feedback signal is then fed into a system controller to accurately obtain the critical dimensions of the sample.

BACKGROUND OF THE INVENTION

The Scanning Tunnelling Microscope (STM) technology introduced a new concept in measurements using a probe-type approach to map the surfaces. Atomic Force Microscopy (AFM) is a variation of this technology. The difficulty with AFM and STM is the measurement of trenches in two dimensions. Both require sophisticated multi-connected interferometers to detect the 2-D tip motion.

In the original atomic force microprobe, a very small probe tip with a submicron radius floated across a slowly undulating surface with displacements at the nanometer level to characterize surface terrain of a sample. The tip was vibrated perpendicular to the surface and depending upon the distance from the surface, a change in cantilever tip resonance occurred due to the Van der Waal's force between the surface and the tip. This change in resonance was sensed with a laser heterodyne interferometer. The tip could be maintained either at a fixed height through a feedback loop or the change in resonance could be converted to a height signal. The sensitivity of the change in resonance allowed accurate height measurements at the nanometer level. The tip to sample spacing was in the range of a few tens of nanometers. In this mode of operation, the tip to sample spacing remained constant as the sample was scanned using a piezo-electric scanning stage. The principal drawback of this mode of operation was the limited resolution and accuracy of the measurements in the lateral X-direction due to tip geometry.

G. Binnig, C. F. Quate, and C. Gerber, "Atomic Force Microscope," Physics Review Letters Vol. 56, pp. 930–933 (1986) described an atomic force microscope that was capable of investigating surfaces of insulators on an atomic scale. It was a combination of the principles of the scanning tunnelling microscope and the sylus profilometer. In this system the force between tip and sample was repulsive and four orders of magnitude larger than what could be achieved with AC vibrating techniques applied to the tip.

Later on, Y. Martin, C. C. Williams, and H. K. Wickramasinghe, "Atomic Force Microscope-Force Mapping and Profiling on a Sub-100 Angstrom Scale", Journal of Applied Physics, Vol. 61 (10), pp. 4723–4729 15 May 1987) described a modified atomic force microscope employing a tungsten tip at the end of a wire mounted on a piezoelectric transducer. The transducer vibrated the tip at the resonance frequency of the wire, which acted as a cantilever. A laser heterodyne interferometer accurately measured the amplitude of the AC vibration. The long range force between the tip and the sample is an attractive force of the Van der Waals type. When the tip came very close to the sample, the force of attraction became significant, the tip would stick to the sample, and the force required to pull the tip away from the surface of the sample could be measured. A polarized laser beam was reflected off the wire carrying the tip to monitor the vibration of the lever even when it was excited into vibrations having amplitudes of several hundred angstroms.

U.S. Pat. No. 4,724,318 (Binnig) discloses an atomic force microscope and method for imaging surfaces with atomic resolution. A sharp point is brought so close to the surface of a sample to be investigated that the forces occurring between the atoms at the apex of the point and those at the surface cause a spring-like cantilever to deflect. The cantilever forms one electrode of a tunneling microscope and the other electrode being a sharp tip. The deflection of the cantilever provokes a variation of the tunnel current, and that variation is used to generate a correction signal. Also disclosed is a XYZ-drive which permits a sample to be displaced in X, Y, and Z directions with respect to a stationary point.

U.S. Pat. No. 4,747,698 (Wickramasinghe, et al.) discloses a scanning thermal profiler. Apparatus is provided for investigating surface structures irrespective of the materials involved. Piezo electric drivers move the scanning tip both transversely of, and parallel to, the surface structure. Feedback control assures the proper transverse positioning of the scanning tip and voltages thereby generating a replica of the surface structure to be investigated. Also disclosed is that in any suitable manner, the sample and the scanning tip can be moved relative to each other in three dimensions such as having three piezo drives. Piezo drives operate in the lateral dimensions X and Y, and can also adjust the relative positions of the sample and scanning tip in the Z dimension. Alternatively, the probe may be fixed and the sample moved relative to the scanning tip.

U.S. Pat. No. 4,806,755 (Duerig, et al.) discloses a micromechanical atomic force sensor head. The micromechanical sensor head is designed to measure forces down to $10^{-13}N$. It comprises a common base from which a cantilever beam and a beam member extend in parallel. The cantilever beam carries a sharply pointed tip of a hard material. In contrast to the scanning tunneling microscope where the tip head had to be electrically conducting the tip, the tip may now be made of any solid material, conducting or nonconducting. The distance between tip and surface typically, will be on the order of one tenth of a nanometer or one angstrom.

U.S. Pat. No. 4,883,959 (Hosoki et al.) for "Scanning Surface Microscope Using a Micro-Balance Device for Holding a Probe-tip" describes a probe tip which can detect a Van der Waals' force. The probe tip is placed on a balance bar which is part of a micro-balance apparatus. A magnetic member controls the magnetic field to control the equilibrium of the micro-balance apparatus. The atomic forces on the probe cause the micro-balance to be displaced by the negative forces between the probe tip and the surface of the sample. It should be noted that Hosoki et al. employed a negative force while a positive force was employed in the Martin et al system.

"Microprobe-Based CD Measurement Tool," IBM Technical Disclosure Bulletin, Vol. 32, No. 7, page 168 (Dec. 1989) describes "a metrology tool which utilizes the atomic force microprobe (AFM) . . . as a surface sensor and is specifically designed for measuring trench depth and width . . . " The system incorporates a two-dimensional length measurement system, such as a two-axis laser interferometer in addition to a two-dimensional laser heterodyne system which detects the change in resonance of the vibrating probe tip as it approaches the surface. The probe tip may be vibrated in either the horizontal or vertical direction depending upon which surface is being approached. The mean position of the probe tip is held stationary while the wafer or other part being measured is moved parallel or perpendicular to its surface and the displacement measured. The article described use of a three-point probe tip with well-defined sensor points for detecting the bottom, right and left edges of the trench. The probe tip is lowered into the trench using robotic motions. The tip is then moved from left to right at a specific height above the bottom of the trench. Trench widths are thereby measured as a function of height, and thus, edge slope can be determined. When the tip dimensions are known, accurate measurements of trench dimensions can be made. In addition, this system provides accurate control of tip position, thereby preventing accidental tip damage.

These above-mentioned techniques, as well as all related methods have the resolving power to map molecular surfaces as long as the topography is shallow. For trenches and complex topography, these approaches are limited due to the tip convolution effects, at the slopes of the trench and/or linewidth to be measured.

The current tips, such as the parabolic tungsten tips have a tip radius of approximately 0.1 micrometers, but 0.01 micrometers and smaller tips have been fabricated in other materials using electron beam deposition techniques. See related U.S. patent applications Ser. No. 07/568,451 and Ser. No. 07/619,378, which now allow the measurement of deep and narrow trenches.

Furthermore, the current SFM technology is limited to a single axis probing and the two-axis probing requires the use of external laser interferometric sensing for the positional information. On the other hand, this invention provides a three-dimensional mapping technique, whereby the linewidth or trench surface is first obtained from the optical profile resulting from the optical metrology technique and which allows one to rapidly profile the surface with a SFM to higher nanometer definitions.

The Scanning Force Microscope (SFM) of this invention can be used for CD (Critical Dimension) linewidth and overlay measurements for sub-half-micrometer feature dimensions, such as 0.35 micrometers and below. The tip geometry is not the only problem with the previous instruments. From a metrology point of view, one needs independent lateral (X) and height (Z) dimensional measurements (at any height). Even by adding a vibration and interferometric sensing system for the change in resonance in the X-direction, the mode of operation described earlier has a second problem, i.e., the tip goes in and out of the X-direction force range in scanning across a line or trough with steep edge slopes.

OBJECTS AND SUMMARY OF THE INVENTION

An object of this invention is to provide a metrology instrument to achieve accurate and independent X, Y, and Z-distance measurements needed for CD linewidth and overlay metrology.

Another object of this invention is the simultaneous in-situ measurement of linewidth with both optical microscopy techniques and non-contact AFM. This allows for direct comparison of SFM and optical measurements.

Still another object of this invention is to attach a scanning tip vibrator to a regular optical objective which allows its coupling to a regular metrology tool.

Yet another object of this invention is the use of a remote heterodyne interferometer to measure the tip vibration through the optical microscope turret system to a first order independent of relative vibration level between interferometer and optical metrology tool.

Another object of this invention is to provide a system where independent coarse and fine adjustment (i.e., positioning and scanning) of a wafer can be done.

Yet still another object of this invention is the independent measurement of sample position done entirely on precision scan stage.

Another object of this invention is the automatic focusing of wafer done by taking advantage of the through the lens optical microscope system coupled with vacuum actuator on the sample holder.

Yet another object of this invention is the coupling to a regular optical metrology tool, which allows the inputting of line scan data from SFM into the optical metrology routines in order to obtain a linewidth number.

Still another object of this invention is the simultaneous observation of the SFM scan field with the metrology tool.

Yet still another object of this invention is the provision of beam steering optics which are part of this invention which allows for a novel method of placing the laser beam onto the cantilever without disturbing the interferometer alignment or the viewing optics.

Yet another object of this invention is the coarse and fine test site alignment and focusing of the wafer relative to the optical microscope objective.

Still another objective of this invention is to prevent tip crashing, by only descending the tip after the tip has been perfectly aligned to the trench or linewidth to be measured.

Yet still another object of this invention is to provide a metrology system for measuring the dimensions of a structure on a sample by simultaneous in-situ measurement of linewidth with both optical microscopy techniques and non-contact (SFM) Scanning Force Microscope, and allowing for direct comparison of SFM and optical measurements, as well as fine details of the sample profile.

In one aspect this invention is a metrology tool for measuring critical dimensions in a sample comprising:
a) a probe having at least one tip,
b) at least one white light source for directing a white light for detecting proximity of said probe to said sample,
c) at least one beam steering means for directing a beam of light for detecting proximity of said probe to said sample,
d) at least one means for insuring said white light and said beam of light reaches said probe in a colinear manner,
e) at least one output signal indicative of the relationship of said probe to said sample, and
f) vibrating at least a portion of said probe at the surface of the sample and obtaining said at least one output signal, and thereby obtaining said critical dimensions of said sample.

In another aspect this invention is a metrology tool for measuring critical dimensions in a sample comprising:
a) a probe having at least one tip,
b) at least one optical fiber means for directing a beam of light for detecting proximity of said probe to said sample,
c) at least one output signal indicative of the relationship of said probe to said sample, and
d) vibrating at least a portion of said probe at the surface of the sample and obtaining said at least one output signal, and thereby obtaining said critical dimensions of said sample.

Still another aspect of this invention is a method of measuring the critical dimension of a linewidth comprising the steps of:
a) focusing a white light source on at least a portion of a line, and measuring said linewidth to optical resolution,
b) then lowering a SFM probe and measuring the same linewidth to atomic resolution.

And still another aspect of this invention is a method of avoiding a tip crash by electronically analyzing the measurement and the location of the sample before lowering the probe so as to avoid a tip crash.

The foregoing and other objects, features and advantages of the invention will be apparent from the more particular description of the preferred embodiment of the invention which follows.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
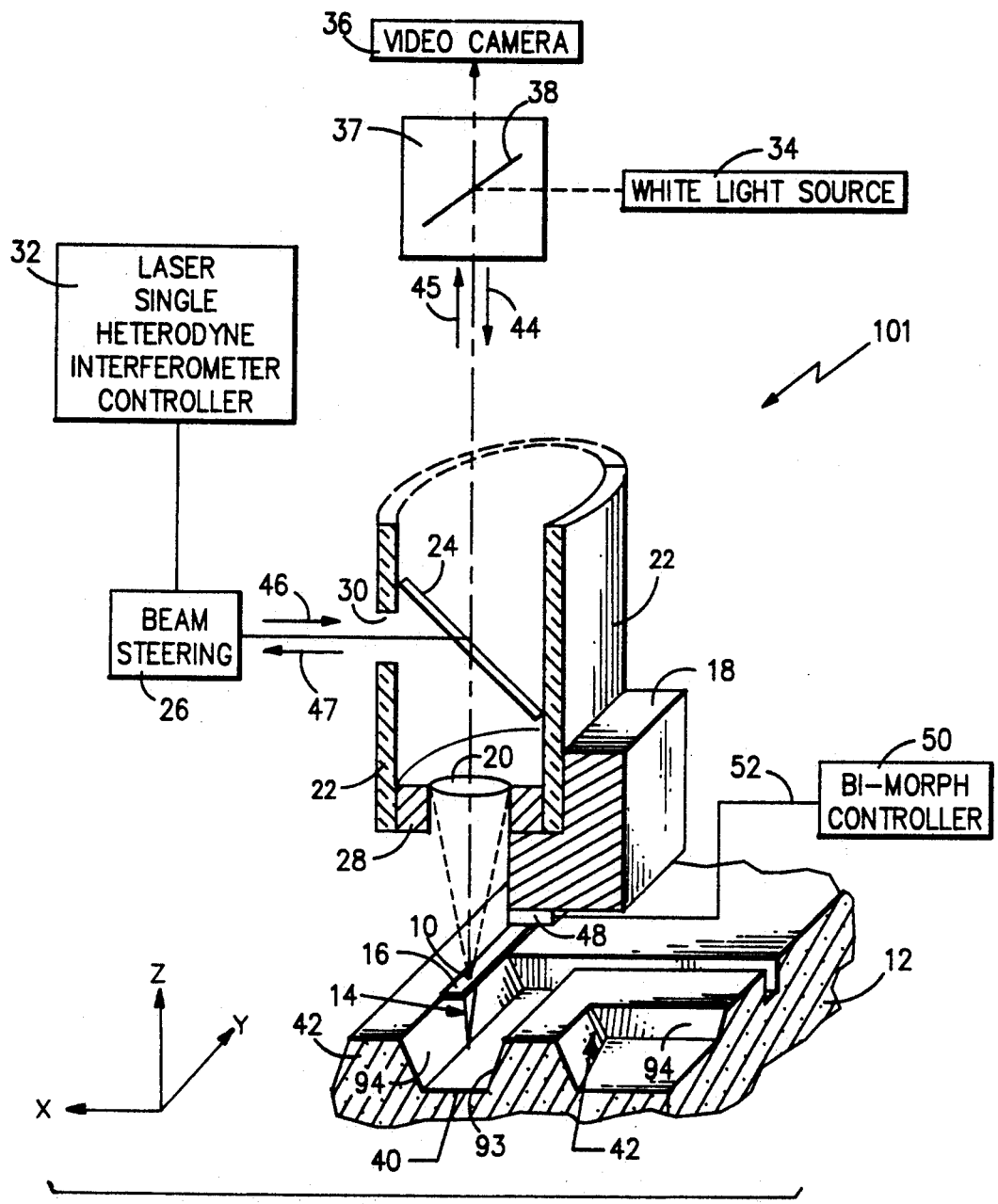
FIG. 1, is a schematic view of a scanning probe tip attachment for a one-dimensional SFM system in "Z" direction combined with an optical metrology tool.

This invention provides various techniques to extend the technology to wafer metrology by adding a multidimensional capability to the system. Without this capability, the mapping of deep trenches with recessed side surfaces would not be available.

This invention also introduces a special switchable laser optical path which is capable of monitoring the tip position in the X or Y and Z planes.

This invention utilizes a unique laser-heterodyne system to monitor the instantaneous tip position. This invention is a derivative of the Scanning Tunnelling Microscope (STM) invented by IBM Zurich Lab as part of a STM Technology for conductive surfaces. The Scanning Force Microscope (SFM) measures the Van der Waal force between the probe tip and target surface. A feedback loop controls the gap (approx. 50 Angstroms) as the surface is being scanned.

This invention also discloses and describes three different approaches that can be used to map the surface of the sample. The first is the use of a laser heterodyne system to detect tip position, with feedback control through a microprocessor. The tip position is monitored by a single laser optical path.

The second is a variation of the first approach in the use of a pair of switchable optics for the two optical paths. By alternating the vibration with Z and X piezos, the vertical topography is first detected, and then switching to the second optical path the trench side topography can be detected. Another approach would be to "simultaneously" drive the two-dimensional "Z" and "X" piezos at equal, or each at different, frequencies and/or amplitudes so as to create a two-dimensional orbital scanning tip motion to extract the top, bottom and slope surfaces from a modulated signal without convolutions.

The third approach is the use of fiber optics in a different way by bouncing some of the laser energy back from the flat end of the fiber over the target, replacing the mirrors from the previous design.

The last two approaches of this invention eliminate the convolution error of the tip on the side wall, because the "X" AFM approach is used to directly detect the slope of the trench. Additionally, this invention can be used to work with any type of surface or surface material.

There is no known measurement technology other than SEMs for advanced metrology requirements such as those imposed by the ground rules associated with the near future high density chips which are less than say 200 nm. These requirements dictate measurement precisions in the range of 10 nm at 3 sigma confidence level be achieved across CD dimensions with aspect ratios of 5 to 1 where the depth of the linewidth profile exceeds 1 micron.

One aspect of this invention is the technique of combining the surface terrain following concept of the SFM which maintains a constant gap between the tip and the terrain surface of the trench and/or linewidth, with a classical broad band white light optical microscope.

Some of the advantages of this system are:
1) simultaneous in-situ measurements of the sample's surface with both SFM and optical microscopy.
2) This system is not restricted to only conductive materials as disclosed and discussed by the STM system.
3) In this invention no special surface preparation is needed.
4) This invention can be used at room temperature and no vacuum environment is required.
5) By aligning, focusing and measuring the features on the sample with the optical microscope eliminates tip crashes because the tip can be lowered in a precise manner.
6) This invention allows the measurements of structures down to the angstrom or atomic scales
7) Additionally, the tip does not physically contact the target surface while mapping the surface and therefore the target is not damaged or destroyed, and nor is the tip.
8) Laser Heterodyne System monitors tip position.
9) Force between tip and sample are monitored and maintained constant. If gap changes, tip compensates to maintain gap. Thus, tip position maps surface topography.
10) Constant force means constant gap; means good mapping of sample.
11) Two-dimensional tip control for orbital scanning tip motion and signal feedback to extract side slope surfaces profile without convolution errors from the resulting modulated SFM signal.

This system is adapted for measuring the width (X) and depth (Z) of trenches at various (Y) positions along the trench. The trench is first lined up with the Y-axis of the measuring system parallel to the trench.

FIG. 1, is a schematic view of a scanning probe tip attachment for a one-dimensional SFM system combined with an optical metrology tool. FIG. 1, in combination with FIGS. 2 and 3, shows a detailed view of the cantilever beam 16, having a scanning or probe tip 14, attached to the mirror/lens housing 22, via a bimorph piezo 48, and tip support structure 18. The bimorph piezo 48, vibrates the attached cantilever beam 16, which in turn vibrates the probe tip 14, in the Z-direction.

The bimorph piezo 48, can also translate in the "Z" direction to lower the tip onto the trench 40, or linewidth 42, on the sample or target 12, and to follow the surface topology of the sample 12, as the sample 12, is scanned. The scanning tip 14, is normally mounted at the end of the cantilever beam 16, but it can be attached to the cantilever beam 16, at any appropriate location. Tip support structure 18, is firmly attached to the body of the mirror/lens housing 22.

The sample 12, typically has at least one trench 40, having side wall slopes 93 and 94, and linewidth 42. The sample 12, whose surface has to be mapped can be made of any material, whether it is electrically conducting or not. The sample could also have other geometries such as holes, raised lines, mesas, etc.

By moving the tip 14, across the trench 40, and/or linewidth 42, the entire profile of the surface area can be mapped, and therefore the absolute value of the trench 40, and/or linewidth or overlay 42, depending on the target can be calculated.

The system starts with optical focussing, optical aligning and making an optical measurement with the broad band white light optical microscope. This is done by sending a broad band white light along exiting white light path 44, from a white light source 34, through a beam splitter 38, to the trench 40, or linewidth 42. The white light is reflected back from the sample 12, entering white light path 45, through the beam splitter 38, that is contained in a beam splitter housing 37, where it is detected, such as by a video camera 36. The signal is then displayed on a video display 56, as well as digitized and transmitted to the system controller 58. The position of the probe can also be measured using at least one optical microscope. Once this is accomplished the tip is vibrated, preferably at its natural frequency. This vibrating tip is now lowered to the desired location on the now aligned target, which is typically on the order of about 50 Angstroms away from the surface of the target or sample.

From these positions, the center of the trench 40, can be determined and the tip 14, can descend near the slope automatically until the bottom surface is within the force sensing range of the tip 14. (It has been assumed that the sample has been coarsely and finely aligned previously and has been positioned with respect to the Y-direction. Leveling can be done if necessary.)

Because the probe tip is allowed deliberately to go in and out of force sensing range in both the X-direction and the Z-direction, an additional means of tracking the probe position is required. This is achieved by adding X-direction and Z-direction interferometry, which is accurate to within the sub-nanometer range.

In the conventional scanning mode, in addition to producing inaccurate lateral measurements, there is no feedback and control system for motions in the lateral direction. Therefore, the probe tip 14, could easily be damaged by bumping into the vertical side walls of a trench 40. In the system described, when the high aspect ratio tip 14, descends into the trench 40, and the tip 14, comes within the critical force range, the sidewall is sensed safely by the tip 14. Full control of the tip 14, is achieved, thereby eliminating tip damage.

As is done with fine focussing mechanisms, this system uses a succession of fine motion control and sensing systems. For example, for coarse positioning, a white light metrology optical system, can be used to bring the probe tip 14, near the critical force range of the top surface. Optical pattern recognition techniques can be used both for locating the feature to be measured and for alignment with mechanical stages for coarse positioning. Piezoelectric stages coupled with the optical character recognition are also provided as part of the white light metrology system, included in this invention, which are then used for fine positioning and measurement.

From a laser source in a laser single heterodyne interferometer controller 32, a beam of light, such as a laser beam 46, is sent to a beam steering mechanism 26. The exiting laser beam 46, is shown, reflecting off the partially reflective mirror 24, and focused by the objective lens 20, onto the top surface of the cantilever beam 16, which is directly above the probe tip 14. The laser beam 46, is then reflected back from the cantilever beam 16, through the objective lens 20, and partially reflective mirror 24, into the beam steering mechanism 26, and onto the laser heterodyne controller 32, as shown in FIG. 1.

Figure 2A:
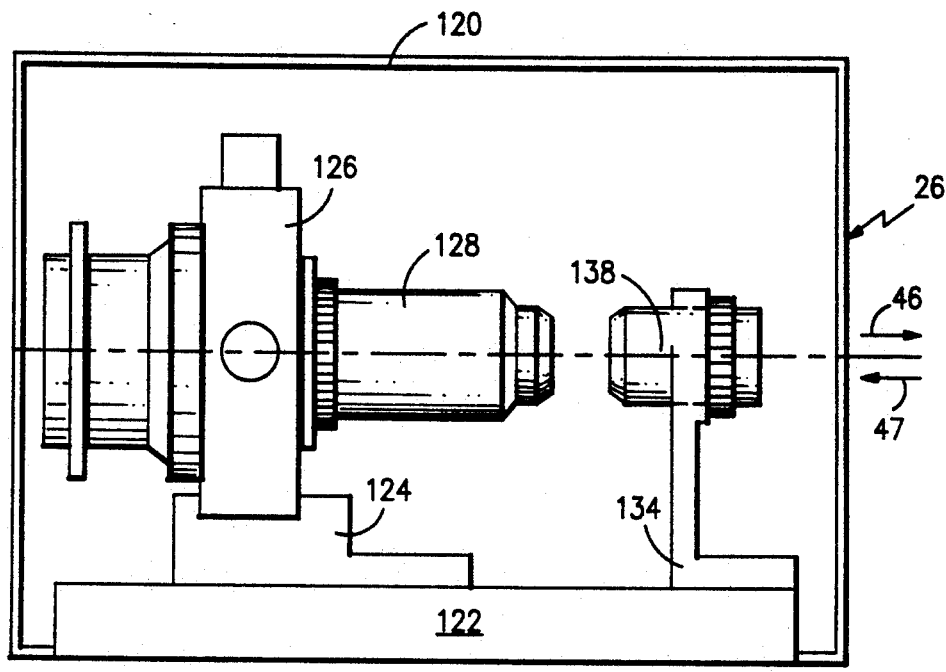
FIG. 2A, is a schematic view of a laser beam steering opto-mechanical system.
Figure 2B:
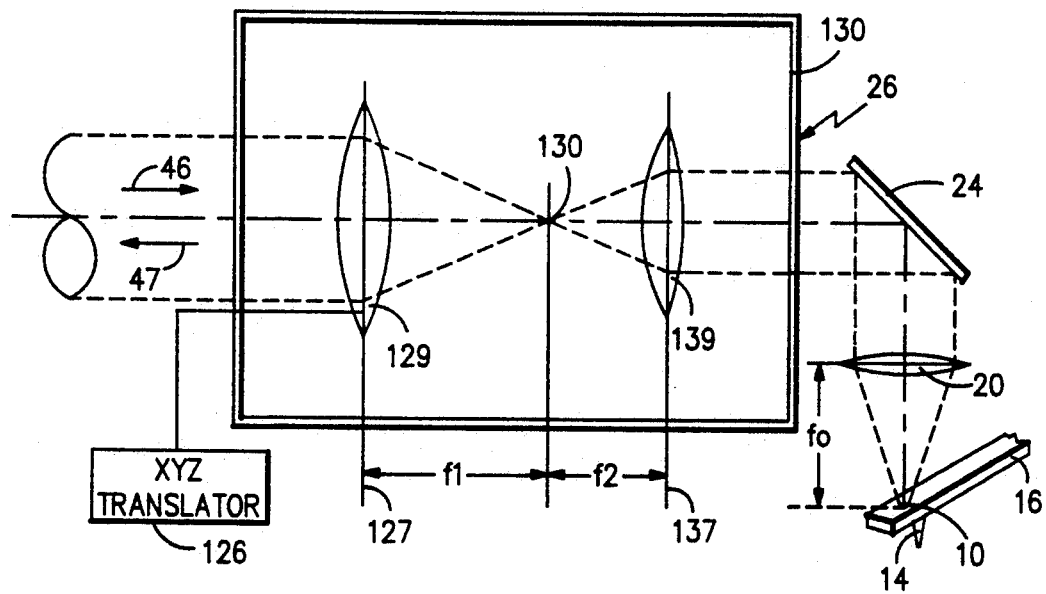
FIG. 2B, shows the beam steering optics of FIG. 2A.
Figure 3:
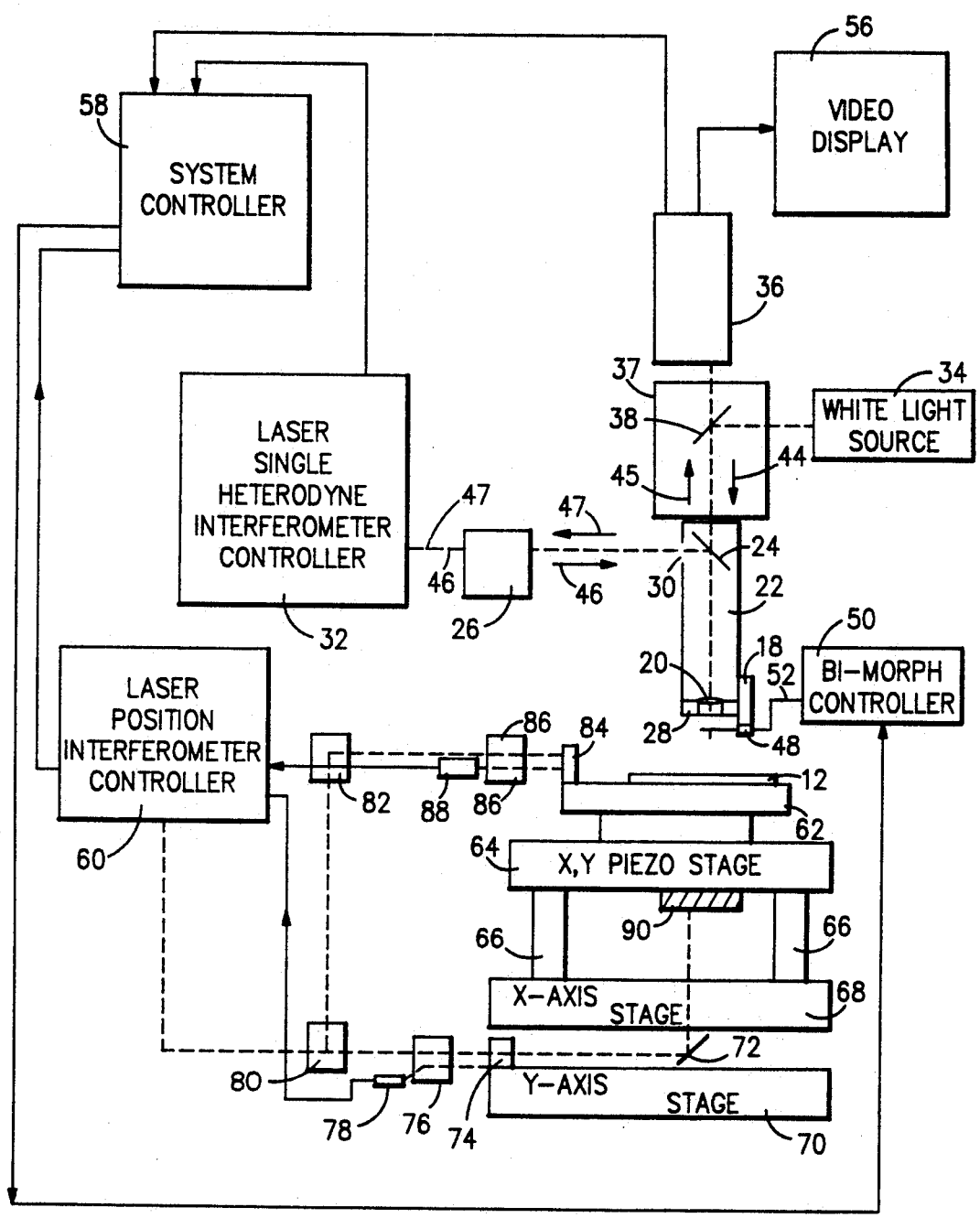
FIG. 3, is a schematic view of a combined SFM and optical metrology tool for one-dimensional SFM probing.

The beam steering mechanism 26, is described in more detail in FIGS. 2A and 2B. The beam steering mechanism 26, ensures that the reflected or entering laser beam 47, goes back into the laser heterodyne controller 32, colinearly with the exiting laser beam 46. The laser heterodyne controller 32, provides a measure of the phase and amplitude of tip 14, vibration near the cantilever beam 16, resonant frequency. The spacing or gap between the tip 14, and the sample 12, is controlled by measuring the shift in amplitude or phase of the signal from the tip vibration near resonance. The gap is controlled by utilizing the change in the amplitude or phase signal to provide "Z" motion feedback for bimorph piezo 48, in order to maintain a constant vibration amplitude or phase.

Thus, in a typical measurement, as the probe tip 14, approaches the surface of the sample 12, in a given direction (X or Z), digitized position data (X and/or Z) is acquired from the laser heterodyne interferometer controller 32, along with a digitized voltage signal (corresponding to the approach direction) from the laser position interferometer controller 60. The latter voltage is proportional to the sideband amplitude of the heterodyne interferometer signal beam against the reference frequency which activates the cantilever beam 16. As the probe tip 14, approaches the sample 12, the resonance frequency of the cantilever beam 16, and tip 14, shifts causing a drop in the sideband amplitude voltage. If the system is sufficiently stable from vibration and noise), data may be taken until the sideband amplitude drops to approximately 10 percent of the value before the approach was made. Alternatively, the entire trench surface can be mapped incrementally.

FIG. 2A shows in a schematic view the laser beam steering opto-mechanical system which comprises of a beam steering housing 120. A mounting plate 122, having a first lens housing 128, and a second lens housing 138, secured to it by means of first lens bracket 124, and second lens bracket 134, respectively. A XYZ translator 126, is attached to the first lens housing 128, which allows the first lens 129, to move in X or Y or Z directions. A similar XYZ translator could also be attached to the second lens housing 138. The mounting plate 122, itself is secured to the beam steering housing 120.

FIG. 2B, illustrates the beam steering optics 130, which consist of two confocal objectives lenses, first lens 129 and second lens 139, with focal lengths $f_1$ and $f_2$, respectively. The first lens 129, is connected to an XYZ translator 126. The Z translation is used to ensure that the objectives lenses 129 and 139, are confocal. If the first lens 129, is translated in X or Y, the output beam from the second lens 139, will be deflected by a small angle (ALPHA) and given by $$\sin \text{ALPHA} = \frac{\text{DELTA}}{f_2}$$

where DELTA is the X or Y translation.

The exiting laser beam 46, is then directed towards the SFM objective lens 20. The tilt ALPHA in the laser beam 46, results in a shift in the position of the focused spot at point 10, on the cantilever beam 16. The shift in position DELTA at the cantilever beam 16, is given by $f_o \sin \text{ALPHA}$, where $f_o$ is the focal length of the SFM objective lens 20, assembly. The entering laser beam 47, reflecting off the top surface of the cantilever beam 16, retraces the original path through the beam steering optics 130, and goes back into the laser heterodyne interferometer controller 32, parallel to the exiting laser beam 46. This ensures that the phase fronts are matched, in order to obtain proper heterodyne mixing which is independent of the position of the focused spot at point 10, on the cantilever beam 16.

The distance L, which is the distance from the center of the second lens 139, to the entrance pupil of lens 20, should be chosen such that when the first lens 129, is moved laterally by a small amount, say DELTA, the physical position of the laser beam 46, hitting the entrance pupil of lens 20, remains unchanged. A simple expression can be derived for the distance L from the following considerations:

If the first lens 129, is moved laterally by DELTA from its on-axis position, the translation of the physical position of the laser beam 46, at the exit pupil of the second lens 139, will be DELTA $(1+f2/f1)$. In order to maintain a fixed position of the laser beam 46, at the entrance pupil of the objective lens 20, assembly, we must have:

$$L \times \sin(\text{ALPHA}) = \text{DELTA} (1+f2/f1)$$

Substituting for sin (ALPHA), we have, $$L = f2(1+f2/f1)$$

By choosing L according to this criterion, we will ensure that as the laser spot 10, is moved across the cantilever beam 16, the laser beam enters through the same physical region of the entrance pupil of the lens 20, assembly and as a result provides minimum aberrations due to focusing.

FIG. 3, shows a probe measuring system including a control system in accordance with this invention. An X-Y piezoelectric stage 64, supports a sample holder 62, carrying a sample 12. The stage of this invention is similar to the micropositioning stage disclosed in U.S. Pat. No. 4,506,154, the disclosure of which is incorporated herein by reference. The X, Y stage is supported by a set of three separate actuators for the fine Z motion of the stage. There is an X-axis sub stage 68, and a Y-axis sub stage 70. Both of these stages are used for the X and Y coarse positioning. The trench 40, is initially centered under the probe tip 14, using the X and Y axis substages. The position of the trench 40, is monitored by a laser position interferometer controller 60, system during measurement. Z-piezoelectric stage or transducers 66, support elements which carry the X-Y piezoelectric stage 64, above the X-axis sub stage 68. The X-axis substage 68, in turn is supported upon the Y-axis sub stage 70, with a slideable relationship between stages 68 and 70.

A line connects a high voltage power supply which is controlled by the system controller 58, to the X piezo elements embedded inside the X-Y piezoelectric stage 64, as will be well understood by those familiar with piezoelectric stages. The X piezo elements provide micromotion to the sample holder 62, in the X direction. Similarly, a line connects a high voltage power supply which is controlled by the system controller 58, to actuate the Z-piezoelectric stage or transducers 66. Thus system controller 58, actuates the Z-piezoelectric stage 66, beneath the surface of the X-Y piezoelectric stage 64. A line from the system controller 58, controls the high voltage power supply to control the voltage to the Y position piezo actuators on X-Y piezoelectric stage 64. Thus the system controller 58, actuates the Y piezo elements inside of X-Y piezo stage 64. Thus, in summary the system controller 58, actuates the X and Y piezo elements of stage 64, as well as the Z-piezo stage 66. The signals on lines to the power supplies are produced based upon the data fed back from the position interferometer controller 60, (as a function of position information received thereby) to system controller 58. Feedback is provided to the system controller 58, for fine positioning of the X,Y piezo stage 64, as desired.

A line 52, from bimorph controller 50, connects to the bimorph piezo element 48, for vibrating the cantilever beam 16, in the X-direction. The bimorph controller 50, is energized by the line from the system controller 58. The line 52, provides a similar function by vibrating the cantilever beam 16, in the Z-direction. The probe or tip can be actuated in both X and Z directions independently of each other or simultaneously with each other. The simultaneous actuation of the probe or tip creates an orbital motion for the tip 14, or the cantilever beam 16. Of course, both the frequency and amplitude of the tip or beam motion can be varied in X, Z or both directions by an appropriate signal from the bimorph controller 50.

The phrase "orbital motion" as used herein not only means a circular or elliptical motion, but also other types of motions, such as, rectangular or polygonal motion to name a few. This is of course achieved by varying the amplitude of the tip in the X and Z directions. The speed of the direction or path of the "orbital motion" can be varied by changing the input frequency of the cantilever beam 16, from the bimorph piezo elements 48 and/or 248, in the Z and/or X direction.

Exiting laser beam 46, from laser single heterodyne interferometer controller 32, (which also includes a polarizing beam splitter, mirror and quarter wave plate) is bent 90 degrees by the partially reflective mirror 24, which directs the laser beam 46, to a spot 10, on the cantilever beam 16. The laser beam 46, is reflected from the cantilever beam 16, to detect the resonance of the probe tip 14, in the X-direction. The surface of the cantilever beam 16, which reflects the laser beam 46, and the cantilever beam 16, itself are tilted slightly to accommodate the angles required to accommodate the mirror 24. The reflected laser beam 47, from laser beam 46, goes to the beam steering mechanism 26, and then to the laser heterodyne controller 32.

The results of the measurement is detected by the X-axis stage detectors 88, and Z-axis stage detector 78, for the X position and Z position, respectively and provides outputs to the laser heterodyne interferometer controller 32, which provides outputs on the lines to the system controller 58, detecting the X and Z resonances of the probe relative to the sample 12. A line connects the supply signals to the system controller 58, from the laser position interferometer controller 60, which is connected to receive the output signals from the double axis laser heterodyne interferometer controller 32.

The X, Y, and Z positions of the sample 12, are measured using the laser position interferometer controller 60. A laser beam from the laser position controller 60, is split by beam XYZ stage splitter mirror 80, into three beams, one going to detect the X-position, the second to detect the Y-position, and the third to detect the Z-position of the sample. FIG. 3, is a two-dimensional schematic representation of the system and therefore only the components to detect the X and Z-positions are shown. One laser beam goes via Z-axis reference mirror 76, through a Z-axis mirror 74, to reflector or mirror 72. The laser beam is then directed through a window (not shown) in the X-axis sub stage 68, to a Z-position reference mirror 90. The laser beam is then reflected back to the mirror 72, through the Z-axis mirror 74, to the Z-axis reference mirror 76, and to the Z-axis stage detector 78. Z-axis stage detector 78, provides an output signal to the laser position interferometer controller 60, which has three output lines to the system controller 58.

The remainder of the laser beam passes through beam splitter 80, which sends part of the laser beam to the mirror 82, to obtain the second measurement. The laser beam passes through the X-axis reference mirror 86, to the X-axis mirror 84. The laser beam is reflected back to the X-axis reference mirror 86, yielding output laser beam which is detected by a X-axis stage detector 88, to yield output to the laser position interferometer controller 60.

Analogously, for the Y-position, the laser beam is reflected off the mirror 82, to reflect back yielding an output laser beam to a Y-position stage detector which provides an output signal to the position interferometer 60.

The X-axis stage 68, and the Y-axis stage 70, may then be translated after the sample 12, is lowered via the Z-piezo stage 66, to prevent tip 14, to trench 40, or linewidth 42, crash. As shown in FIGS. 1 and 3, a white light or broad band metrology channel is provided in combination with the SFM channel. This channel is comprised of white light source 34, beam splitter 38, objective lens 20, and video camera 36. This channel is used to measure the trench 40, or linewidth 42, on the sample 12. It is also used to coarsely align and then fine-align the test site or structure to be measured on the sample 12, with high accuracy.

Figure 4A:
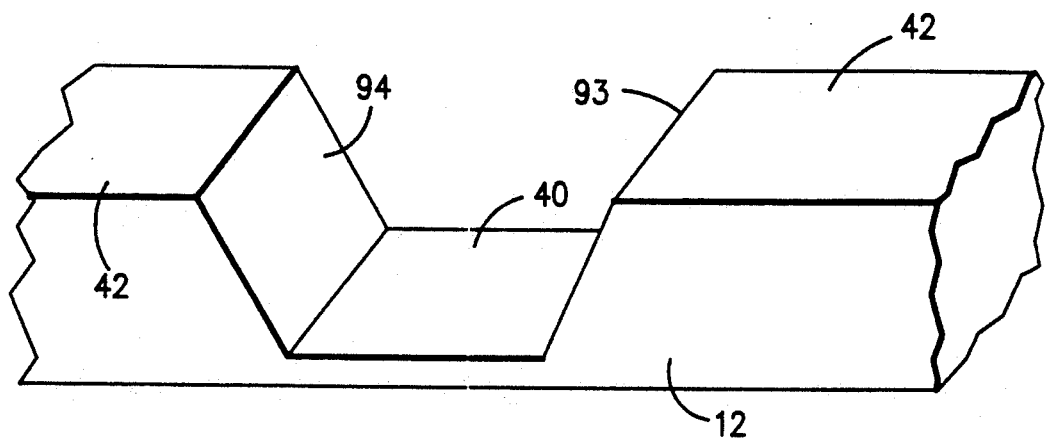
FIG. 4A, is a schematic view of the physical structure of a trench and/or a line width.

The sample 12, is now raised via the "Z" piezo stage 66, and now may be measured at atomic scale magnification and resolution. In the white light mode optical focus is obtained using the automatic focusing system via the video camera 36. The illumination system 34, for the optical microscope channel is shown in FIGS. 1 and 3. The white light is focused on the sample 12, via beam splitter 38, and objective lens 20. The beam 44, is reflected from the sample 12, to form an optical image on the solid state video camera 36, which is easily translated into an intensity profile depicting a video scan across the linewidth being measured as shown in FIG. 4C. The data is transmitted to the system controller 58, which has at least one means for analyzing at least one measured signal via an algorithm resident in a computer to determine the critical dimensions. With proper thresholding algorithms resident in the system controller 58, the linewidth 42, is determined.

Figure 4B:
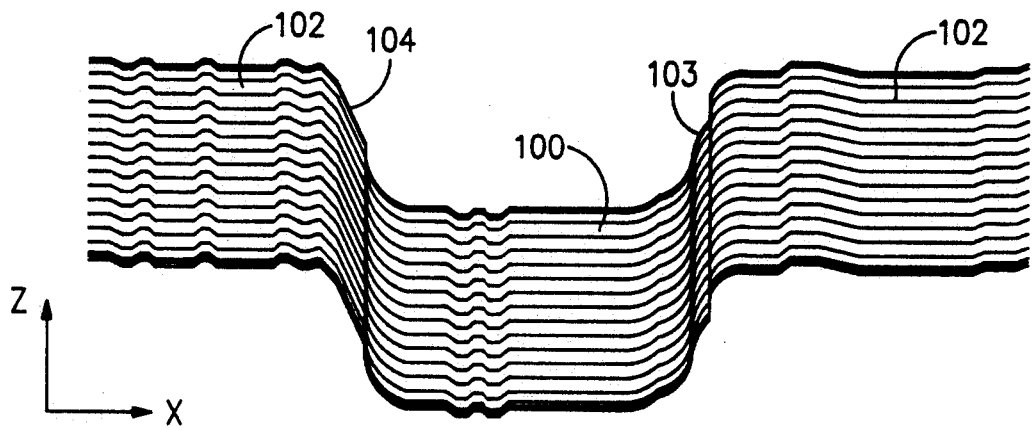
FIG. 4B, is a schematic view of an image profile response of the structure of FIG. 4A, using the SFM probe.
Figure 4C:
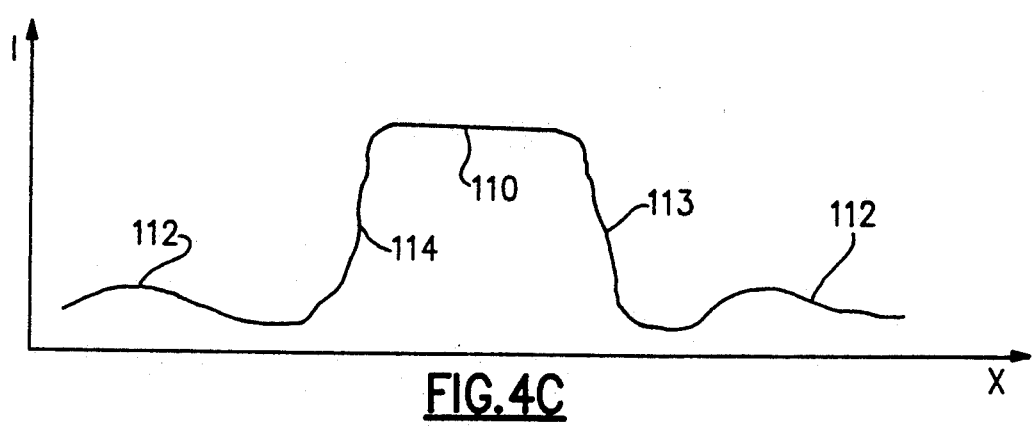
FIG. 4C, is a schematic view of an image profile response of the structure of FIG. 4A, using the optical metrology channel.

By moving the sample 12, with X-Y piezoelectric stage actuators 64, a scan signal of the linewidth 42, is created as shown in FIG. 4B. This signal is fed to a system controller 58, along with X-Y piezoelectric stage 64, positional data which come from laser position interferometer controller 60, off the X-Y piezo stage 64. In this manner a two-dimensional scanning force microprobe scan, shown in FIG. 4B, can be obtained. The linewidth 42, is shown as 102, slopes 103 and 104, correspond with slopes 93 and 94, respectively. The trench 100, corresponds to the trench 40, on the sample 12.

FIG. 4C, shows an image profile response of the structure or sample 12, of FIG. 4A. This sample is obtained from the light intensity profile optically reflected from the structure of interest from the sample 12, which is transmitted to the video camera 36, via the return optical path 45. By the application of proper edge detection algorithms residing in the system controller 58, the proper linewidth and/or overlay of the structure to the preceding structure on the prior layer/level of the sample 12, are calculated. Image 110, corresponds to the trench 40, while images 113 and 114, correspond to the slopes 93 and 94, respectively, on the sample 12. The linewidth 42, shows up as an image 112.

Figure 5:
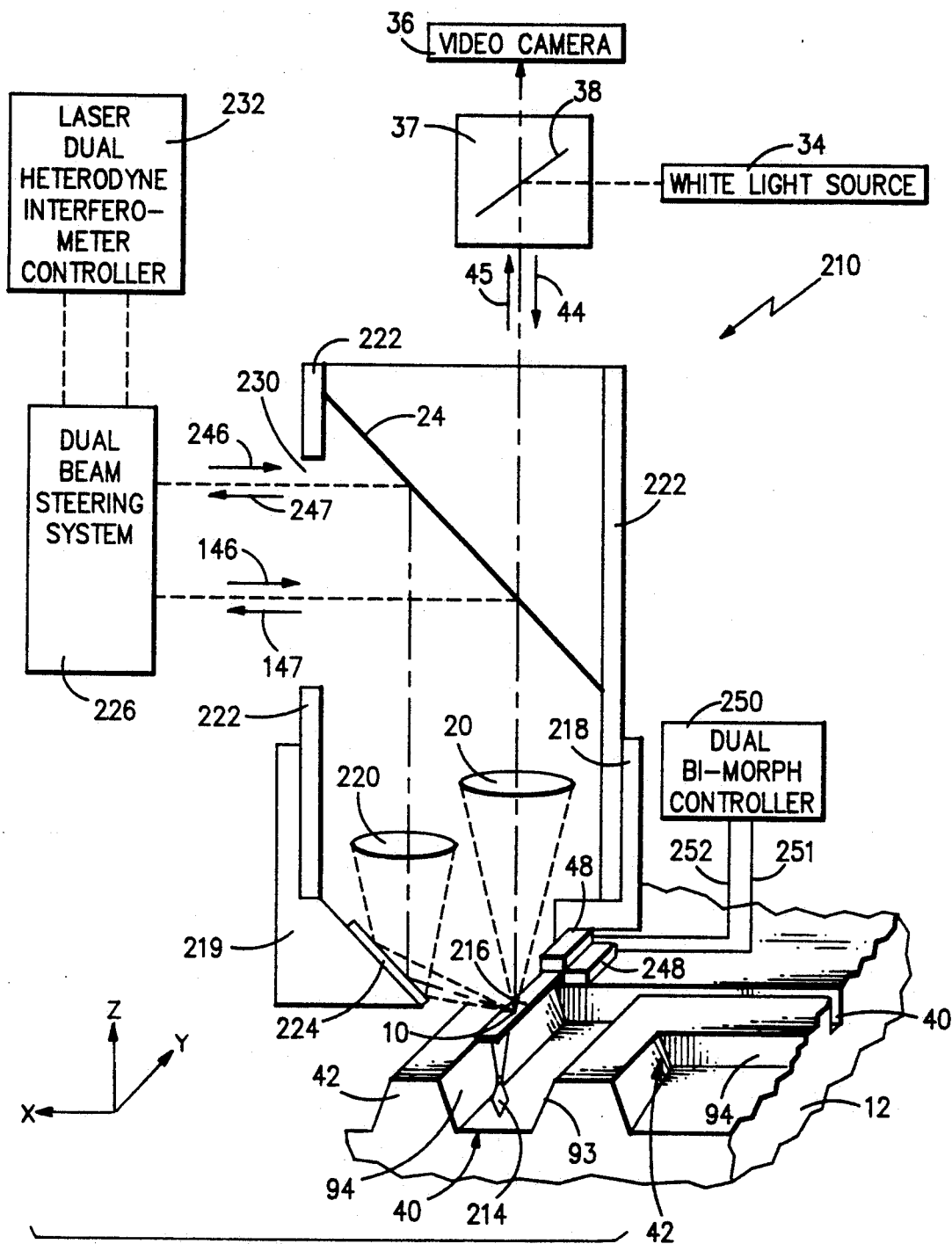
FIG. 5, is a schematic view of a scanning probe tip attachment for a two-dimensional SFM system in "Z" and "X" directions combined with an optical metrology tool.
Figure 6:
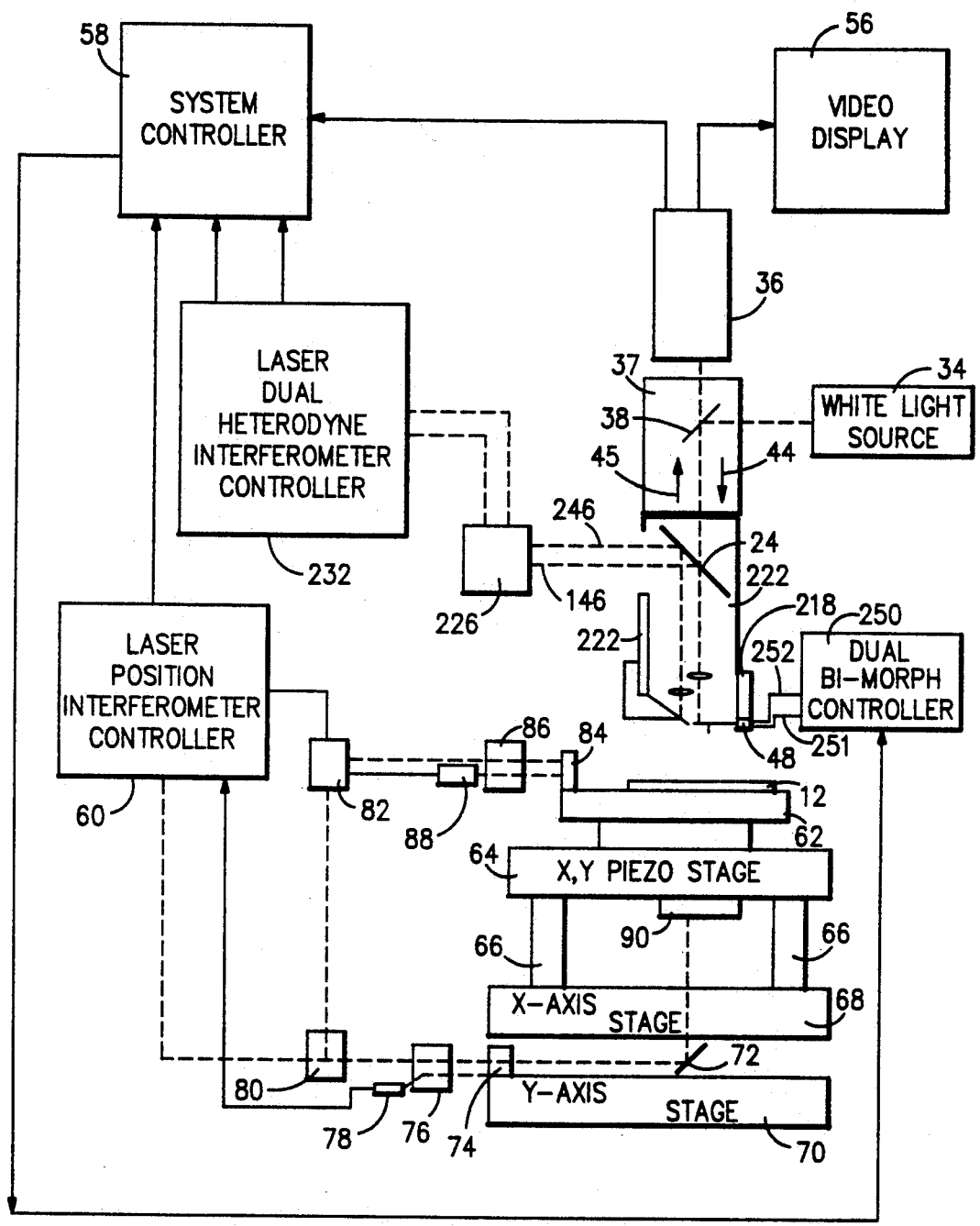
FIG. 6, is a schematic view of a combined SFM and optical metrology tool for two-dimensional SFM probing.

FIGS. 5 and 6, illustrate a two-dimensional SFM system 210, having a tip attachment which is combined with a broad band white light optical metrology tool. This system achieves the SFM capability in two directions, X and Z. Dual bimorph 48 and 248, are provided to vibrate the cantilever beam in Z and in X by means of the dual bimorph controller 250. The bimorph controller may be driven to control X & Z individually at different times or simultaneously to provide an orbital tip scanning motion. Dual beam steering system 226, and laser dual heterodyne interferometer cantilever 232, are provided to handle the additional second laser path 246. A second objective lens 220, is also provided along with a partially reflective mirror 224, to deflect and focus the light on the vertical side of cantilever beam 216. Hence, the reflected light from the cantilever beam 216, sidewall is obtained and returned via path 247, to the dual beam steering system 226, and onto the dual heterodyne controller. This X-position signal provides a true representation of the trench 93, 94 and/or linewidth sidewalls. The trench dimension is extracted from the modulated signal obtained at the laser dual heterodyne interferometer controller 232. Thus, the normal convolution signal error, obtained with the one-dimensional SFM (FIGS. 1 and 3) is eliminated. The system incorporates a two- or three-dimensional probe sensing system comprising a two axis laser heterodyne interferometer preferably with a probe tip adapted for sensing surfaces in both the X and Z directions inside trenches in the work pieces being measured. Here, the three lobe tip 214, is vibrated and the change in resonance of the tip 214, is sensed in both the X-direction and the Z-direction using laser heterodyne interferometry.

A first exiting laser beam 146, from laser dual heterodyne interferometer controller 232, (which also includes a polarizing beam splitter, mirror and quarter wave plate) passes through the dual beam steering system 226, and is bent 90 degrees by the partially reflective mirror 24, which directs the laser beam 146, to the first objective lens 20. The laser beam then reflects from the cantilever beam 216, to detect the resonance of the probe tip 214, in the X-direction. Similarly, a second laser beam 246, is sent from the dual heterodyne interferometer controller 232, to the mirror 24, via the dual beam steering system 226. The second laser beam 246, then reflects down to the second objective lens 220, and is reflected off the second partially reflective mirror 224, to the cantilever beam 216, to detect the resonance of the probe tip 214, in the Z-direction. The surface of the cantilever beam 216, which reflects the laser beam 246, and the cantilever beam 216, itself are tilted slightly to accommodate the angles required to attach the mirror 224. The reflected laser beams 147 and 247, from laser beam 146 and 246, respectively, goes to the dual beam steering mechanism 226, and then to the laser dual heterodyne controller 232, in a colinear manner. The processed information is then sent to the system controller 58.

The dual bi-morph controller 250, sends a signal via lines 251 and 252, to vibrate the cantilever beam 216, X-bimorph 248, vibrates the cantilever beam 216, in the X-direction, while Z-bimorph 48, vibrates the cantilever beam 216, in the Z-direction. When both the bimorphs 48 and 248, are energized the cantilever beam 216, will rotate orbitally. The movement of the cantilever beam 216, moves the three lobed tip 214, which detects the surface profile. The tool should have at least one means of adjusting a light spot 10, created by the beam of light on the upper surface of the cantilever beam, while maintaining colinearity with the return beam of light into the beam steering means.

Figure 7:
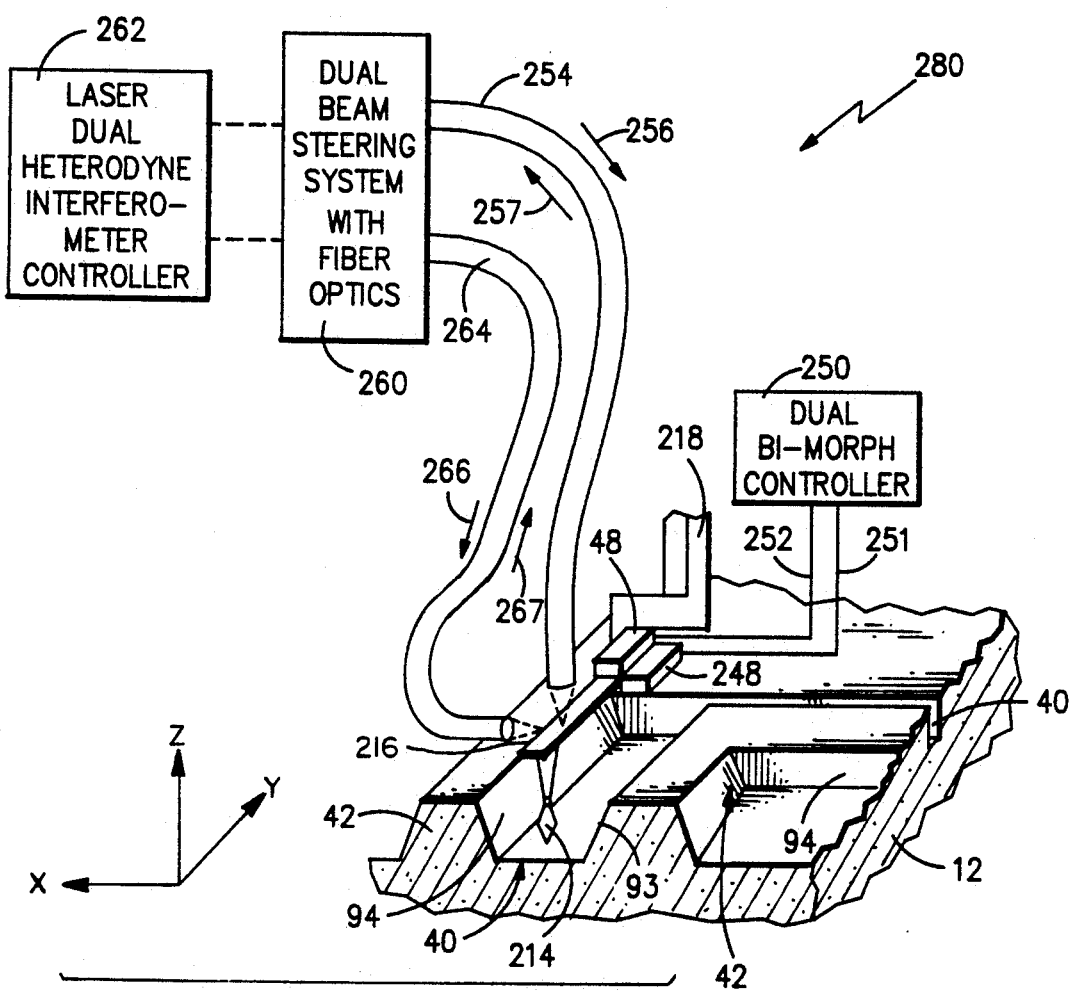
FIG. 7, is a schematic view of a scanning probe tip attachment for a two-dimensional SFM system utilizing fiber optics.

FIG. 7, illustrates a scanning probe tip attachment for a two-dimensional SFM system 280, utilizing fiber optics 254, 264 for optical path signal transmission and receiving at the laser dual heterodyne interferometer controller 262, through the dual beam steering system with fiberoptics 260. Arrows 256, 257, 266 and 267, show the direction of the light going through the optical fiber. Note that objective lenses 20, 220 and mirror 224 are no longer utilized. Both the controller 262, and dual beam steering system 260, are similar to the ones discussed earlier, except that they are modified to accommodate the optical fibers 254 and 264.

The mirror/lens housing 222, as shown in FIGS. 5 and 6, can be modified to accommodate the optical fibers 254 and 264. This can be achieved, for example, by replacing the objective lenses 20 and 220, with the optical fibers 254 and 264, respectively, to obtain the desired optical signals from the cantilever beam 216, to the laser dual heterodyne interferometer controller 262. The optical fiber 254, provides the Z-axis optical signal, while the optical fiber 264, provides the X-axis optical signal from the cantilever beam 216. Of course, it would be obvious to one skilled in the art to use the objective lenses 20 and 220, in combination with the optical fibers 254 and 264.

The atomic-force microprobe, shown in FIGS. 1, 3, 5, 6 and 7, is a depth and width sensor which indicates when the probe is a given distance from a surface to be sensed. For measurement, it is used in the conventional scanning mode. The tip geometry should preferably be of the form shown in FIG. 2, of U.S. patent application Ser. No. 07/619,378. Another tip geometry that can be used with an atomic force microprobe system as disclosed in U.S. patent application Ser. No. 07/608,043. European Patent Applications Serial Nos. 413,040, 413,041 and 413,042, also disclose methods of producing micromechanical sensors and micromechanical sensor heads for AFM/STM's. The disclosure of all of these references is incorporated herein by reference.

The tip vibration is generated by a pair of piezos (bimorphs) in the two planes. Z-bimorph 48, vibrates flexure vertically and X-bimorph 248, vibrates flexure side ways. This approach requires a special tip design. Tip measurements are taken sequentially, first the vertical tracking, then the side tracking to map the side walls of the trench 40, or simultaneously by orbiting the tip.

Therefore, the user can change tips/cantilever with the ability to place the laser beam onto the back of the probe.

The resolving power of this system is a function of the tip size. E-beam and micro-mechanical approach can produce the necessary tip geometries.

The exact shape of the tip 14, of FIGS. 5 and 7, is not important, as long as the lobe points of the tip 14, come within probe force range during a measurement. Therefore, the tip 14, can be either rotationally symmetric or it can maintain the same cross-sectional shape but with a taper in the perpendicular, Y-direction.

A high aspect ratio nanometer scale tip is grown on top of a conventional silicon tip. The tip shaft diameter is on the range of 100 nm while the cone apex tip diameter is on the order of 25 nm. The high aspect tip shaft length is on the order of 4 micrometers. The high aspect ratio tip makes possible the measurement of trenches ranging on the order of 0.25 micrometers or 250 nm.

One of the basic problems of dimensional measurements with the microprobe is calibration of the tip. That is, for the case of conventional wide angled tip, the determination of the tip dimensions and more particularly the geometry of the tip of the probe.

Tungsten tips are approximately parabolic in shape and can vary in radius due to the method of manufacture. When scanning deep edged trenches, the point of the tungsten tip which determines the maximum force and resulting change in resonance varies with height and for some heights, it does not come within force range at all. Accurate measurements can be made only at the width at the top of the trench, and then only when the exact geometry of the tip is known and can be deconvolved from the measured profile.

An improved tip design currently being pursued is made by etching silicon along the crystal planes and it results in a known tip geometry with a very small tip radius. However, the angle of the tip is such that the tip does not come within force range for edge slopes steeper than the tip angle.

The preferred method for making tips controllably with small dimensions is described in Lee and Hatzakis J. Vac. Sci. Technol. B7(6), pp. 1941-1946 (Nov/Dec 1989), and also in U.S. patent Ser. No. 07/568,451, entitled "Method of Producing Ultrafine Silicon Tips for the AFM/STM Profilometry", and also in U.S. patent application Ser. No. 07/608,043 entitled "Nanometer Scale Probe for an Atomic Force Microscope, and Method for Making Same". The disclosure of both of these references is incorporated herein by reference.

Alternatively, microlithographic techniques analogous to those used for preferential etching of silicon tips can be employed except that etching is not along the crystal planes. A metal layer is patterned to produce an anvil-like structure. Any taper which occurs in the Y-direction due to etching of a thick metal layer is desirable.

The probe tip 214, of FIGS. 5 and 7, is a three lobe tip, i.e., it has three protruding points in the relative positions shown. The maximum dimension for the tip 214, should be less than the narrowest trench width to be measured. For example, the tip 214, should preferably be less than 0.35 micrometers for a 0.5 micrometer trench.

This invention is applicable in arts such as data processing where it can be employed in manufacturing semiconductor products for personal computers, minicomputers, large scale computers and other data processing equipment. In particular, this system and process are applicable to the manufacture of VLSI chips for industrial and consumer electronic devices. Electronic products such as transportation and control systems incorporating data processing systems for continuous monitoring and like functions can use products made by use of this invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A metrology tool for measuring critical dimensions in a sample comprising:
   a) a probe having at least one tip,
   b) at least one white light source for directing a white light onto said probe for detecting proximity of said probe to said sample,
   c) at least one beam steering means for directing a beam of laser light onto said probe for detecting proximity of said probe to said sample,
   d) at least one means for insuring said white light and said beam of laser light reaches said probe in a colinear manner,
   e) at least one bimorph piezo for vibrating at least a portion of said probe at the surface of the sample,
   f) wherein said vibrating probe reflects said white light to a video system, and said beam of laser light is reflected by said vibrating probe to at least one heterodyne controller, and therefore a change in vibration of said vibrating probe due to the proximity of said vibrating probe to said sample's surface is viewed through said video system while said heterodyne controller is used to do a continuous measurement of said sample's surface and thereby said critical dimensions of said sample are obtained through said heterodyne controller.

2. The metrology tool of claim 1, wherein said at least a portion of said probe is vibrated at its natural frequency.

3. The metrology tool of claim 1, wherein the reflected white light from said probe is detected via a video camera.

4. The metrology tool of claim 1, wherein at least one output signal indicative of the relationship of said probe to said sample is analyzed by at least one system controller against at least one algorithm resident in a computer to determined said critical dimensions.

5. The metrology of claim 1, wherein said probe is positioned above said sample via at least one optical microscope.

6. The metrology tool of claim 1, wherein said tool has at least one means for simultaneously determining the surface profile of said sample with optical and SFM techniques.

7. The metrology tool of claim 1, wherein said tool has at least one means for adjusting a light spot created by said beam of laser light on the surface of said probe, while maintaining colinearity with the return beam of laser light into said beam steering means.

8. The metrology tool of claim 1, wherein at least one means is provided in (a) for actuating said probe in at least one direction.

9. The metrology tool of claim 1, wherein at least one means is provided in (a) for actuating said probe in both X and Z directions independently of each other.

10. The metrology tool of claim 1, wherein at least one means is provided in (a) for actuating said probe in both X and Z directions simultaneously thus creating an orbital motion for said tip.

11. The metrology tool of claim 1, wherein said tool has means for simultaneously vibrating said probe and measuring the relative position of said probe.

12. The metrology tool of claim 1, wherein said tool further comprises a means for positioning said sample by moving said sample relative to said tip.

13. The metrology tool of claim 12, wherein said means for positioning said sample moves in at least one dimension.

14. A metrology tool for measuring critical dimensions in a sample comprising:
   a) a probe having at least one tip,
   b) at least one optical fiber means for directing a beam of light onto said probe for detecting proximity of said probe to said sample,
   c) at least one bimorph piezo for vibrating at least a portion of said probe at the surface of the sample,
   d) said vibrating probe reflects said beam of light to at least one controller, and a change in vibration of said vibrating probe due to the proximity of said vibrating probe to said sample's surface is reflected through said beam of light to said controller where it is analyzed by said controller and thereby said critical dimensions of said sample are obtained.

15. The metrology tool of claim 14, wherein said at least a portion of said probe is vibrated at its natural frequency.

16. The metrology tool of claim 14, wherein a white light is directed onto said probe and the reflected white light is detected via a video camera.

17. The metrology tool of claim 14, wherein at least one output signal indicative of the relationship of said probe to said sample is analyzed by at least one system controller against at least one algorithm resident in a computer to determine said critical dimensions.

18. The metrology of claim 14, wherein said probe is positioned above said sample via at least one optical microscope.

19. The metrology tool of claim 14, wherein said tool has at least one means of simultaneously determining the surface profile of said sample with optical and SFM techniques.

20. The metrology tool of claim 14, wherein said tool has at least one means for adjusting a laser spot on the surface of said probe, while maintaining colinearity of a laser beam into a beam steering means through which said laser beam goes to said controller for analysis of said critical dimensions.

21. The metrology tool of claim 14, wherein at least one means is provided in (a) for actuating said probe in at least one direction.

22. The metrology tool of claim 14, wherein at least one means is provided in (a) for actuating said probe in both X and Z directions independently of each other.

23. The metrology tool of claim 14, wherein at least one means is provided in (a) for actuating said probe in both X and Z directions simultaneously thus creating an orbital motion for said tip.

24. The metrology tool of claim 14, wherein said tool has means for simultaneously vibrating said probe and measuring the relative position of said probe.

25. The metrology tool of claim 14, wherein said beam of light is a laser beam.

26. The metrology tool of claim 14, wherein said tool further comprises a means for positioning said sample by moving said sample relative to said tip.

27. The metrology tool of claim 14, wherein said means for positioning said sample moves in at least one dimension.

28. A method of measuring the critical dimension of a linewidth comprising the steps of:
   a) focusing a white light source on at least a portion of a line, and measuring said linewidth to optical resolution,
   b) then lowering an SFM probe and measuring the same linewidth to atomic resolution.

29. The method of claim 28, further comprising the step after step (a) of electronically analyzing the measurement and the location of the sample in step (a) before lowering said probe so as to avoid a tip crash.

* * * * *

UNITED STATES PATENT AND TRADEMARK OFFICE
CERTIFICATE OF CORRECTION

PATENT NO. : 5,298,975
DATED : March 29, 1994
INVENTOR(S) : Henri A. Khoury, Calvin K. Chi, Joachim G. Clabes, Philip C. D. Hobbs, Laszlo Landstein, Martin P. O'Boyle, Hemantha K. Wickramasinghe, Sandra K. Wolterman It is certified that error appears in the above-indentified patent and that said Letters Patent is hereby corrected as shown below:

In column 4, line 51: after "with the" insert --optical video camera system incorporated into the--.

In column 9, line 43: after "stable", delete "from" and insert therefor --(from--.

Signed and Sealed this

Twelfth Day of November, 1996

BRUCE LEHMAN

Attest:

Attesting Officer

Commissioner of Patents and Trademarks